331-98
Dec. 26, 1967 M. D. CLARK 3,360,743
DISTRIBUTED FEEDBACK STRIP TRANSMISSION LINE OSCILLATOR
Filed June 30, 1966
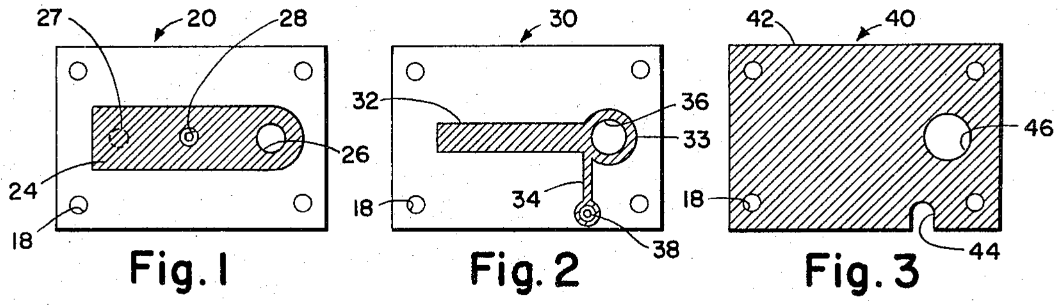
Fig. 1, Fig. 2, Fig. 3
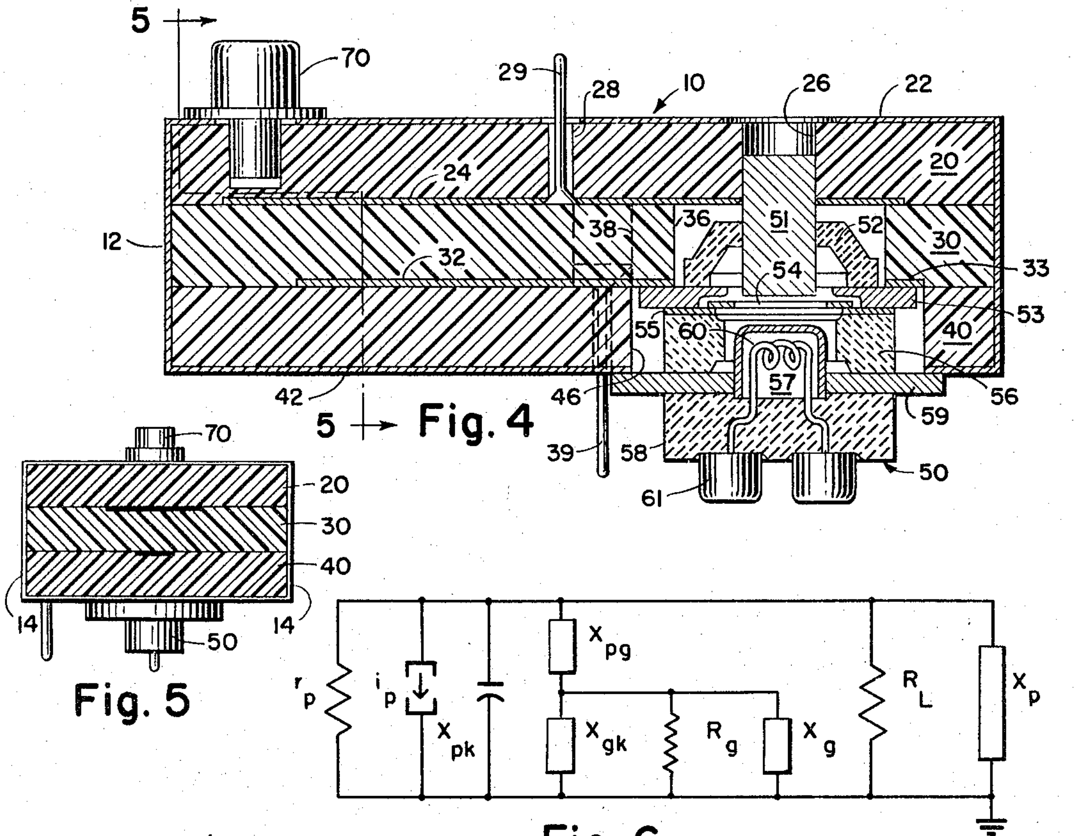
Fig. 4, Fig. 5
Fig. 6
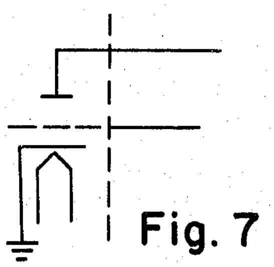
Fig. 7
INVENTOR.
Melvin D. Clark
BY
Roland A. Anderson
Attorney United States Patent Office 3,360,743

Patented Dec. 26, 1967

3,360,743

DISTRIBUTED FEEDBACK STRIP TRANSMISSION LINE OSCILLATOR

Melvin D. Clark, Albuquerque, N. Mex., assignor to the United States of America as represented by the United States Atomic Energy Commission Filed June 30, 1966, Ser. No. 562,953
5 Claims. (Cl. 331—98)

ABSTRACT OF THE DISCLOSURE

An oscillator including a stacked ceramic type triode tube encased within layered printed circuit boards having inductively coupled transmission lines or circuit elements separately disposed between a first and second and the second and a third circiut board in contact with the plate and grid elements respectively of the tube and having outer conductive claddings on the first and third circuit boards respectively, said latter cladding in contact with the tube cathode, wherein the characteristic impedance of the inductively coupled circuit elements and the resonant frequency of the oscillator are functions of the actual and relative sizes of the circuit elements and wherein the outer conductive claddings form the ground planes for the plate circuit element and the third circuit board cladding and plate circuit element form the ground planes for the grid circuit element.

This invention relates to an oscillator and more particularly to a novel strip transmission line oscillator.

Prior art attempts to reduce the size and complexity of oscillators and to increase their reliability, led to the development of coaxial oscillators. These devices necessitated the employment of rather complicated means of construction and resulted in a comparatively large package and in a generally expensive item. Further attempts to reduce the complexity, size, and cost of oscillators led to the development of so-called stripline oscillators.

The oscillator which comprises this invention is a novel stripline oscillator. It is a relatively simple, economically inexpensive, lightweight, low-Q RF oscillator, which includes a stacked or planar triode tube and etched transmission lines. Feedback is achieved in the oscillator by virtue of the mutual distributed capacitance and inductance of the grid and plate lines.

It is an object of this invention to provide a novel oscillator.

It is another object of this invention to provide a strip transmission line oscillator.

It is another object of this invention to provide a novel oscillator utilizing mutual distributed capacitance and inductance for feedback.

It is another object of this invention to provide a simple, compact, and inexpensive oscillator.

This specification, including the description, drawing and claims, has been prepared in accordance with the applicable patent laws and the rules promulgated under the authority thereof.

FIGS. 1 and 2 are plan views of two dielectric circuit boards showing, respectively, plate and grid circuits etched thereon;

FIG. 3 is a plan view of a third circuit board;

FIG. 4 is a sectional view of the strip transmission line oscillator;

FIG. 5 is a view taken along line 5—5 of FIG. 4;

FIG. 6 is a schematic diagram for the equivalent circuit of the oscillator; and

FIG. 7 is a schematic diagram of the oscillator.

As shown in FIGS. 1 to 5, a strip transmission line oscillator 10 may comprise three dielectric boards 20, 30, and 40, each of which may be of a suitable dielectric material such as polytetrafluoroethylene impregnated glass fiber board. Typically, each board may be about two inches long, one end three-eighths inches wide, and about one-tenth of an inch thick. The size, of course, may be varied according to individual design parameters, including, inter alia, tube dimensions and line thickness. A view of one side (the lower, or underneath side) of each of the respective boards is shown in FIGURES 1 to 3. The top of board 20 may be clad with a copper surface 22. The underneath or bottom of board 20 may also be clad with copper which may be appropriately etched to define a plate transmission line 24. If desired, rather than etching copper clad boards, and depending on heat dissipation, unclad boards may be relieved and preformed solid lines of any suitable metal may be inserted therein. A plurality of apertures 18 may extend through the boards 20, 30, and 40 at peripheral locations for the admittance of appropriate fastening means. Aperture 26 may extend through the plate line 24 and the surface 22 and may be diametrally dimensioned for the reception of a portion of a tube 50. Also extending through plate line 24 and surface 22 may be an aperture 28, diametrally dimensioned appropriately for the securement and extension therethrough of a plate feed 29. The plate feed 29 may be attached to an appropriate voltage source, such as, for example, 175 volts D.C. Extending through clad surface 22 and part way through the dielectric of board 20 may be a countersunk hole 27 which may comprise the attachment point for a capacitance or RF output probe 70. The probe may be a coaxial connector modified to provide a variable capacity coupling between the center conductor of the connector and plate line 24.

Circuit board 30 may include an etched grid transmission line 32 on the lower side which may be parallel to plate line 24 when the device is assembled, and, as shown in FIGS. 4 and 5, may be shorter in length and narrower in width. However, the relative widths of the grid line and plate line may vary according to the frequency, the tube type, and whether the oscillator is to be used as a transmitter or as a receiver. Thus, in some cases, the grid line width may be less than, equal to, or greater than, the plate line width. Also etched out of the copper cladding on the lower side of board 30 may be grid feed line 34 which is preferably connected to grid line 32 at collar 33. Extending through board 30 may be an aperture 36, coaxial with aperture 26 but differentiated diametrally therefrom to accommodate a different portion of tube 50. Circumferentially extending around aperture 36 may be etched collar 33 which may function as a connection between a portion of tube 50 and grid transmission line 32. An aperture 38 may extend through board 30 and grid feed line 34 for the attachment of a grid feed 39. The grid feed may be connected to an appropriate bias supply, as for example, −20 volts and an appropriate pulse source. A collar portion of grid feed line 34, analogous in both structure and function to collar 33, may extend circumferentially around aperture 38 and may serve to connect grid feed 39 to grid feed line 34. The upper surface of board 30, which engages the lower, or etched, surface of board 20 may be free from cladding.

The upper surface of board 40, which engages the lower, etched surface of board 30 may also be free from cladding. The lower, or outside, surface of the board may include a copper clad surface 42. An edge portion of the board and cladding may be relieved as at 44 to prevent any possible grounding or contact with grid feed terminal 39. An aperture 46 may extend through board 40 and cladding 42 and may be diametrally dimensioned for the reception of a portion of tube 50. Aperture 46, like aperture 36, is coaxial with aperture 26, but differentiated diametrally therefrom and from aperture 36.

A suitable tube 50, which may be a planar electrode tube, such as a stacked ceramic triode, may penetrate into the three boards, 20, 30, and 40 through coaxial apertures 26, 36, and 46. The anode 51 of the tube may penetrate aperture 26 and may be suitably connected to plate line 24. A grid ring 53 may be disposed intermediate ceramic housing portions 52 and 56 and may be electrically connected to grid 54 through a conductive element 55 disposed on the upper surface of ceramic housing portion 56. The grid ring may also be electrically connected to grid line 32 through collar 33. Thus grid 54 is electrically connected to grid transmission line 32 through conductive element 55, grid ring 53, and collar 33, and to grid feed electrode 39 through feed line 34, the collar, ring, and element.

A hollow cathode 57 may be disposed within the ceramic housing portion 56 on ceramic base portion 58 and it may be electrically connected to clad surface 42 of board 40 through cathode ring 59. Filament heater 60 may be disposed within cathode 57 and may extend through base 58 to terminals 61.

In operation, feedback is achieved by virtue of the mutual distributed capacitance and inductance between the grid line 32 and the plate line 24. Cladding 22 and 42 may comprise the ground planes for plate line 24 and, if the width of the grid line is equal to or greater than that of the plate line, the cladding may also comprise the ground planes for grid line 32. If, as illustrated, the grid line is narrower than the plate line, then the plate line and cladding 42 may comprise the ground planes for the grid line. Cladding on the peripheral edges, as at 12 in FIG. 4 and at 14 in FIG. 5, may serve as additional shielding for the assembled device.

In the design of a particular oscillator, the frequency of oscillation must first be decided upon, and then a tube must be matched to the plate and grid lines. In order to match the lines and a tube the characteristic impedance of the plate and grid lines must be determined. The term "characteristic impedance" may not be technically correct because the plate and grid lines are coupled together, but the term may be used when looking at the two lines individually. The "characteristic impedance" of the plate line, considered by itself, is a function of its width, the dielectric constant, and the thickness of the dielectric. Its resonant frequency is a function of its length. Thus the width of the plate line and the dielectric materials may be appropriately selected so as to give the desired characteristic impedance. Similarly, the characteristic impedance of the grid line, by itself, may be determined according to the stated parameters. The lengths of the two lines may be selected to provide the desired resonant frequency with each other.

FIG. 6 comprises the equivalent circuit of the strip transmission line oscillator, the primary operating principle of which is the distributed feedback between the plate and grid transmission lines. $X_p$ and $X_g$ may comprise the reactances seen looking into the plate line and grid line, respectively. $X_{gk}$ may comprise the grid reactance and $R_g$ may represent loading in the grid region of the tube and dielectric loss in the grid line 32. $X_{pg}$ may comprise the reactance of the plate grid region, which may include the additional capacitance between the grid mounting ring 53 and that portion of the plate line 24 surrounding the anode 51 of the tube 50. $X_{pk}$ may comprise the plate reactance, which may be negligible compared to the other reactances. $R_L$ may represent the reflected load resistance and may include the dielectric losses in the plate grid line. The plate resistance, $r_p$, may be substantially greater than $R_L$. The line length 24 may preferably be adjusted so that $X_p$ resonates with the combination of $X_g$ in parallel with $X_{gk}$ and this parallel connection in series with $X_{pg}$. Energy is supplied to the grid region of the oscillator through the distributed mutual inductance and capacitance of the plate and grid strip transmission lines.

FIG. 7 comprises a schematic diagram of the oscillator and is substantially self-explanatory. The anode and grid line must be resonant at the wavelength of operation. The length of the grid line is usually about one-quarter wavelength and the plate line, because of the total impedance, is usually greater than a quarter wavelength, but less than a half wavelength.

Thus it may be seen that the strip transmission line oscillator comprises a novel simplified, economically inexpensive, and compact oscillator. The small size and wide range of frequencies available make this device suitable for a wide range of applications.

I claim:

1. A strip transmission line oscillator in which feedback is achieved by mutual distributed capacitance and inductance between a plate line and a grid line comprising in combination, a plurality of circuit boards in stacked superposed relationship, the uppermost board having an electrically conductive clad upper surface and the lowermost board having an electrically conductive clad lower surface, a plate transmission line on a surface of a circuit board disposed between the said upper and lower clad surfaces, a grid transmission line on a surface of another circuit board disposed between said plate transmission line and said lower clad surface and having a length less than that of said plate transmission line, said upper and lower clad surfaces comprise the ground planes for the plate transmission line and said plate transmission line and lower clad surface comprise the ground planes for the grid transmission line and a vacuum tube including an anode element operatively connected to said plate transmission line, a grid element operatively connected to said grid transmission line, and a cathode element operatively connected to said lower clad surface.

2. The apparatus of claim 1 in which the peripheral edges are electrically conductive clad to provide shielding for the plate and the grid transmission lines.

3. The apparatus of claim 1 in which a variable capacity coupling probe is operatively attached to said upper clad surface and a portion of said probe penetrates the circuit board affixed thereto.

4. The apparatus of claim 2 which includes a plate feed element operatively connected to the plate transmission line and extending through an aperture through the uppermost board and clad surface.

5. The apparatus of claim 4 which includes a grid feed element disposed adjacent a peripheral edge of said apparatus and operatively connected to the grid transmission line by a grid feed line.

References Cited

UNITED STATES PATENTS 3,237,122 2/1966 Campi ____________ 331—99 X

ROY LAKE, *Primary Examiner.*

S. H. GRIMM, *Assistant Examiner.*